(12) United States Patent
Chen

(10) Patent No.: US 11,158,040 B2
(45) Date of Patent: Oct. 26, 2021

(54) METHOD FOR IDENTIFYING ROBOT ARM RESPONSIBLE FOR WAFER SCRATCH

(71) Applicant: TAIWAN SEMICONDUCTOR MANUFACTURING CO., LTD., Hsinchu (TW)

(72) Inventor: Yen-Liang Chen, Taichung (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 94 days.

(21) Appl. No.: 16/432,344

(22) Filed: Jun. 5, 2019

(65) Prior Publication Data

US 2020/0005445 A1 Jan. 2, 2020

Related U.S. Application Data

(60) Provisional application No. 62/692,408, filed on Jun. 29, 2018.

(51) Int. Cl.
| | |
|---|---|
| *G06K 9/00* | (2006.01) |
| *G06T 7/00* | (2017.01) |
| *B65G 47/90* | (2006.01) |
| *G01B 11/02* | (2006.01) |
| *G06T 7/60* | (2017.01) |
| *G06K 9/62* | (2006.01) |
| *G06T 7/70* | (2017.01) |
| *H01L 21/687* | (2006.01) |

(52) U.S. Cl.
CPC .............. *G06T 7/001* (2013.01); *B65G 47/90* (2013.01); *G01B 11/024* (2013.01); *G06K 9/6202* (2013.01); *G06T 7/60* (2013.01); *G06T 7/70* (2017.01); *G06T 2207/10048* (2013.01); *G06T 2207/30148* (2013.01); *H01L 21/68707* (2013.01)

(58) Field of Classification Search
None
See application file for complete search history.

(56) References Cited

U.S. PATENT DOCUMENTS

| | | | |
|---|---|---|---|
| 10,718,722 B2 * | 7/2020 | Matsuo | .................... G06T 5/50 |
| 2003/0065475 A1 | 4/2003 | Wu | |
| 2005/0058335 A1 | 3/2005 | Lin et al. | |
| 2005/0282299 A1 | 12/2005 | Kim et al. | |
| 2008/0309927 A1 * | 12/2008 | Grueneberg | ..... G01N 21/95607 356/237.1 |

(Continued)

FOREIGN PATENT DOCUMENTS

| | | | |
|---|---|---|---|
| CN | 101399216 A | | 4/2009 |
| CN | 102130030 | * | 1/2010 |

(Continued)

*Primary Examiner* — Randolph I Chu
(74) *Attorney, Agent, or Firm* — Maschoff Brennan

(57) ABSTRACT

In a method for identifying a robot arm responsible for creating a scratch on a wafer, at least one scratch mark on a wafer is detected. A first scratch dimension of the at least one scratch mark is determined. The determined first scratch dimension is compared to a plurality of first robot arm dimensions to generate a plurality of first comparing results, wherein the first comparing results respectively correspond to a plurality of robot arms. One of the robot arms is identified based on the first comparing results.

20 Claims, 13 Drawing Sheets

(56) References Cited

U.S. PATENT DOCUMENTS

2012/0255794 A1\* 10/2012 Fenske .............. H01L 21/67778
　　　　　　　　　　　　　　　　　　　177/1
2015/0276622 A1\* 10/2015 Otani ................. G01N 21/9501
　　　　　　　　　　　　　　　　　　　356/237.5
2019/0194821 A1\* 6/2019 Choi ................. H01L 21/02013

FOREIGN PATENT DOCUMENTS

| CN | 102130030 | A | 7/2011 | | |
|---|---|---|---|---|---|
| CN | 103245667 | A | 8/2013 | | |
| CN | 106290390 | A | 1/2017 | | |
| CN | 108364882 | | \* | 2/2018 | ............. H01L 22/00 |
| KR | 20050120420 | A | 12/2005 | | |
| TW | 504787 | B | 10/2002 | | |
| TW | 201429648 | A | 8/2014 | | |
| TW | 201625388 | A | 7/2016 | | |

\* cited by examiner

METHOD FOR IDENTIFYING ROBOT ARM RESPONSIBLE FOR WAFER SCRATCH

PRIORITY CLAIM AND CROSS-REFERENCE

This application claims priority to U.S. Provisional Application Ser. No. 62/692,408, filed on Jun. 29, 2018, which is herein incorporated by reference in its entirety.

BACKGROUND

Wafers may be transferred multiple times by robot arms during a wafer manufacturing process. Typically, a wafer or a stack of wafers are arranged substantially level with the ground, such that a robot arm can slide under each wafer substantially in a horizontal direction, for picking up and transferring the wafer. However, when a wafer or a robot arm is slanted, the robot arm sliding to pick up another wafer directly above the first wafer might impact and scratch the top surface of the first wafer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
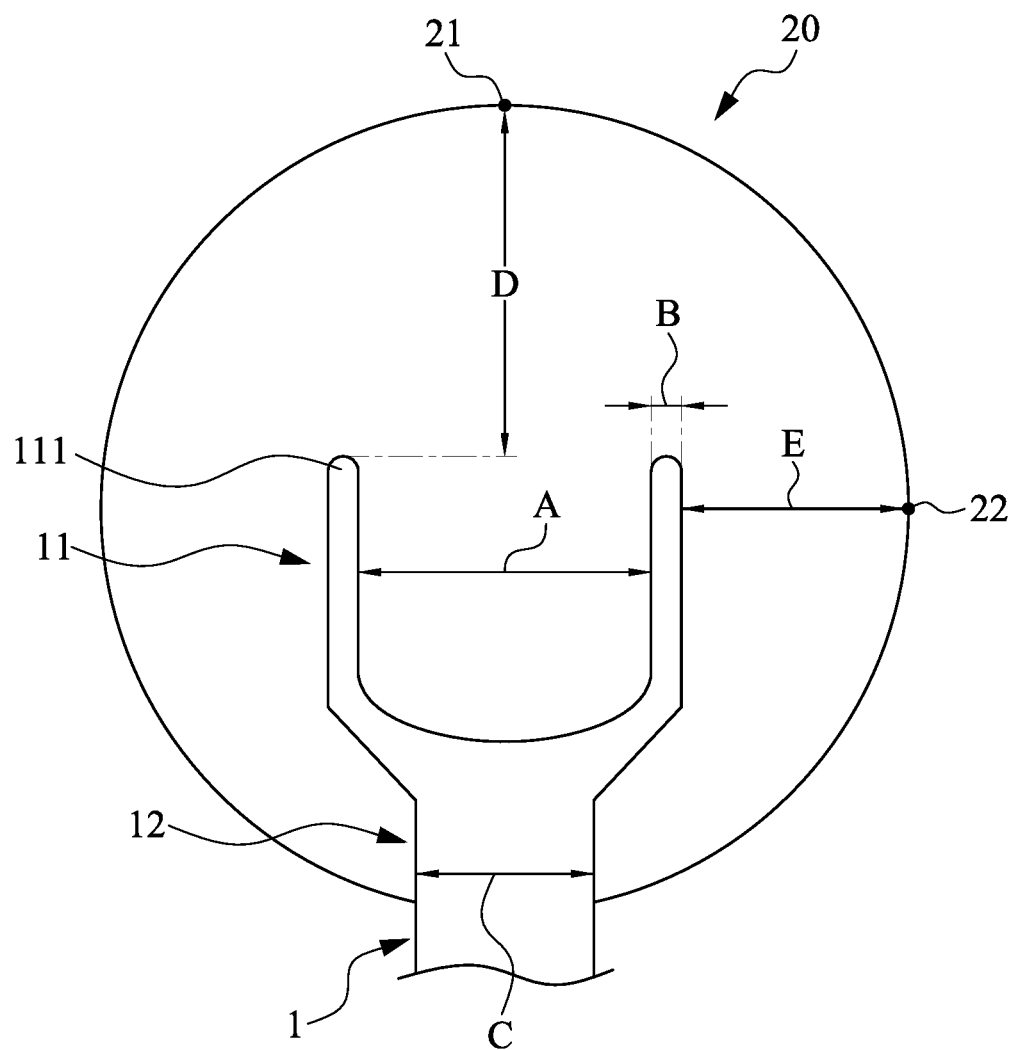
FIG. 1 shows a top view of a robot arm, a wafer, and corresponding robot arm dimensions, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Being able to quickly and efficiently identify the transfer step wherein the scratching occurs increases the cost effectiveness of the wafer manufacturing process. Different robot arms are used by different stations at different transfer steps. Some embodiments of the present disclosure are able to efficiently identify the robot arms that are possible candidates for creating a scratch, and thereby narrow down the transfer steps and stations where the scratching occurs.

To facilitate the process of checking which robot arms are candidates for creating the detected scratch, robot arm parameters including dimensions and orientations of robot arms holding the wafer are inputted into a cloud database. Each of the robot arm dimensions corresponds to a physical feature of a corresponding robot arm. The wafer is placed under a camera module for determining an orientation and/or dimensions of the scratch on the wafer. A computer then compares the detected scratch orientation and/or dimensions to the inputted robot arm orientation and/or dimensions to generate comparing results. If the computer finds that the dimension of the detected scratch on the wafer matches a robot arm dimension in the cloud database, the comparing result corresponding to the robot arm dimension is a match and a robot arm corresponding to the corresponding comparing result can be identified, and considered as a possible cause for producing the scratch on the wafer. If the computer finds that the dimension of the detected scratch on the wafer excludes a robot arm dimension in the cloud database, the comparing result corresponding to the robot arm dimension is an exclusion and a robot arm corresponding to the corresponding comparing result is not identified. Likewise, if the computer finds that the orientation of the detected scratch on the wafer matches or excludes a robot arm orientation in the cloud database, the comparing result corresponding to the robot arm orientation is respectively a match or an exclusion, and a robot arm corresponding to the corresponding comparing result can be respectively identified or not identified. If the computer finds that the orientation and the dimension of the detected scratch on the wafer respectively match a robot arm orientation and a robot arm dimension corresponding to the same robot arm in the cloud database, then the comparing results corresponding to the robot arm orientation and the robot arm dimension are matches, and the robot arm corresponding to the corresponding comparing results can be identified. If the computer cannot find a robot arm dimension or orientation in the cloud database corresponding to the detected scratch dimension or orientation, then the comparing result is neither a match nor an exclusion.

The robot arm dimensions collected for a particular robot arm and inputted into the cloud database relate to physical features of the robot arm that are reflected in a scratch on a wafer by the robot arm. In some embodiments, referring to FIG. 1, dimension B is a width of an end effector 11 of the robot arm 1. A scratch mark created by the end effector 11 of said robot arm 1 has a width of B, or less. Referring again to FIG. 1, dimension A is a distance between two end effectors 11 of the same robot arm 1. Scratch marks created by the two end effectors 11 of said robot arm 1 have a distance A therebetween. Referring again to FIG. 1, dimension D is a distance, in an extending direction of the robot arm 1, between a terminal tip 111 of an end effector 11 of said robot arm 1 and a furthest point 21 on the edge of the wafer 20, when the robot arm 1 is extended to the fullest extent toward the wafer 20. A scratch mark created by the end effector 11 of said robot arm 1 is, in the extending direction of the robot arm 1, a distance D away from the furthest point 21 on the edge of the wafer 20, or more. Referring again to FIG. 1, dimension E is a distance, in a direction perpendicular to an extending direction of the robot arm 1, between the end effector 11 and a furthest point 22 on the edge of the wafer 20. A scratch mark created by the end effector 11 is, in the direction perpendicular to the extending direction of the robot arm 1, a distance E away from the furthest point 22 on the edge of the wafer 20. Referring again to FIG. 1, dimension C is a width of a forearm 12 of the robot arm 1. A scratch mark created by the forearm 12 of the robot arm 1 has a width of C, or less.

Figure 2A:
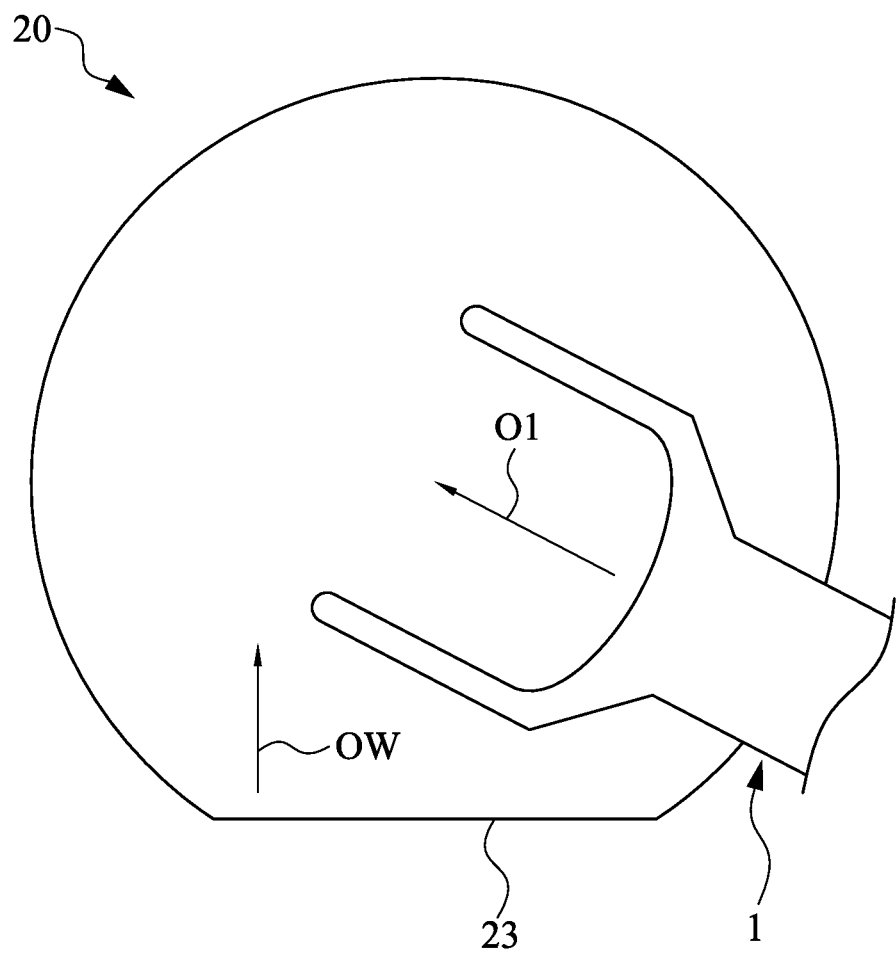
FIG. 2A shows a top view of a robot arm, a wafer, and corresponding orientations, in accordance with some embodiments.
Figure 2B:
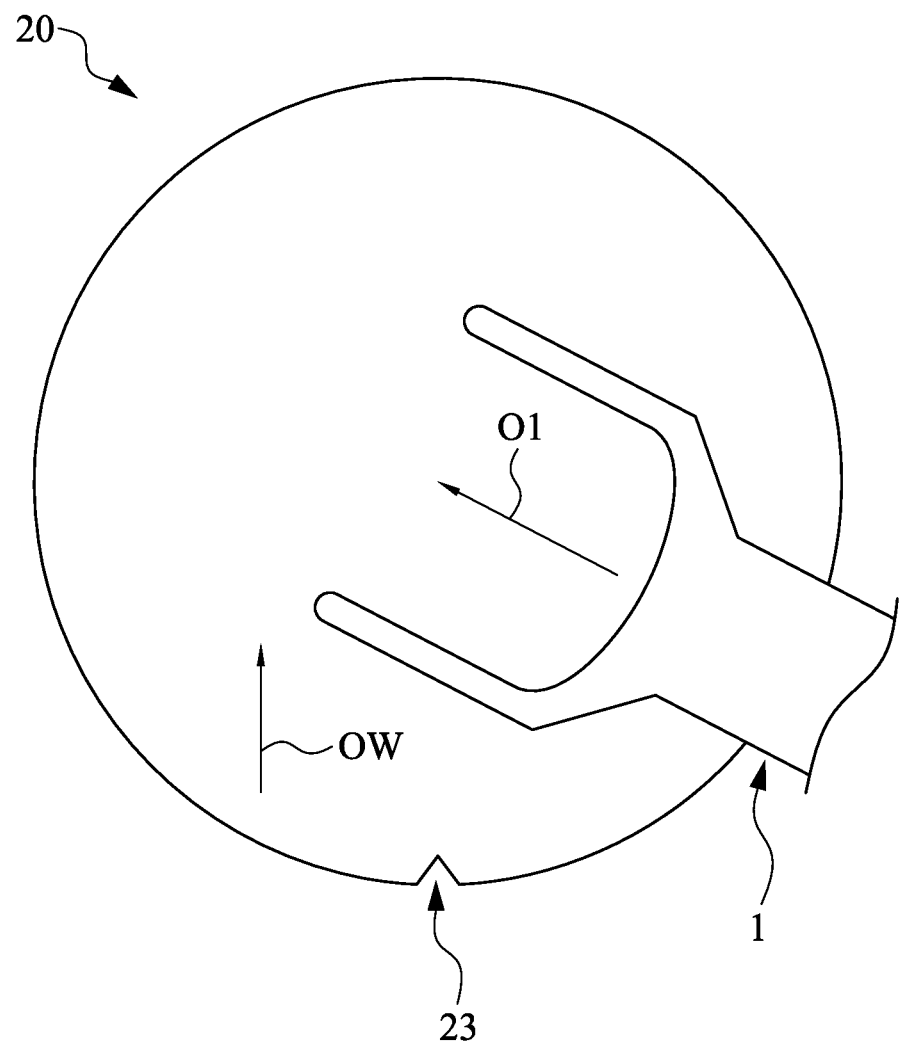
FIG. 2B shows a top view of a robot arm, a wafer, and corresponding orientations, in accordance with some embodiments.

The robot arm orientation collected for a robot arm and inputted into the cloud database is the orientation of the robot arm with respect to the orientation of the wafer the robot arm operates on. The orientation of the wafer can be defined according to an orientation of an orientation mark of the wafer. The orientation mark of the wafer may be a flat edge, a notch, or the like. Referring to FIG. 2A, the orientation OW of the wafer 20 is defined according to a flat edge 23 of the wafer. In some embodiments as shown in FIG. 2B, the orientation OW of the wafer 20 may also be defined according to a notch 23 of the wafer. The robot arm 1 operates on the wafer 20 at an orientation O1 with respect to the orientation OW. A scratch mark created by the robot arm 1 has the same orientation O1 as the robot arm 1.

Figure 3:
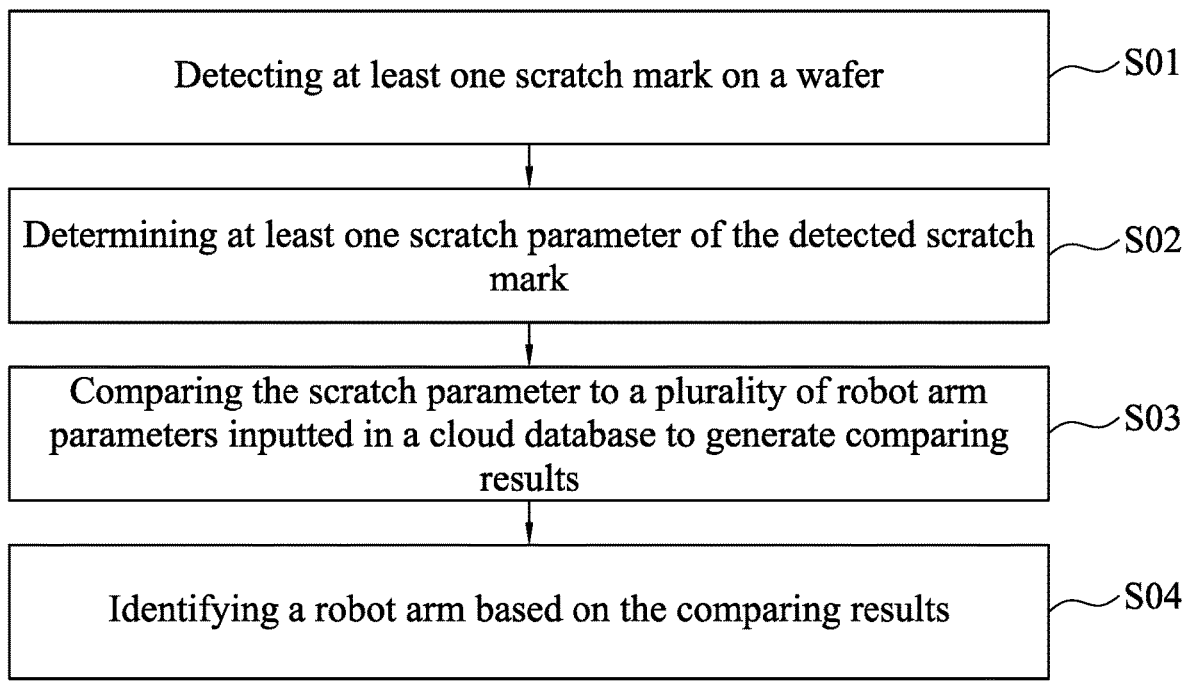
FIG. 3 shows a flowchart of a method for identifying a robot arm responsible for producing a scratch on a wafer, in accordance with some embodiments.

FIG. 3 shows a flowchart of a method for identifying a robot arm responsible for producing a scratch on a wafer according to some embodiments of the present disclosure. In step S01, at least one scratch mark on the wafer is detected. In step S02, at least one scratch parameter of the detected scratch mark is determined. The scratch parameter can be a dimension of the scratch, an orientation of the scratch, combinations thereof, or the like.

In step S03, the scratch parameter is compared to a plurality of robot arm parameters inputted in a cloud database, to generate a plurality of corresponding comparing results. Each of the robot arm parameters corresponds to a particular robot arm used in a wafer manufacturing process. Referring again to FIG. 1, the robot arm parameter can be a distance A between two end effectors 11 of the robot arm 1, a width B of an end effector 11 of the robot arm 1, a width C of a forearm 12 of the robot arm 1, a distance D, when the robot arm 1 is extended to the fullest extent towards the wafer and in an extending direction of the robot arm 1, between a terminal tip 111 of an end effector 11 of the robot arm 1 and a furthest point 21 on the edge of the wafer, a distance E, in a direction perpendicular to the extending direction of the robot arm 1, between the end effector 11 of the robot arm 1 and a furthest point 22 on the edge of the wafer, combinations thereof, or the like. Referring again to FIGS. 2A and 2B, the robot arm parameter can be the orientation O1 of the robot arm 1 with respect to the orientation OW of the wafer 20.

In some embodiments, the robot arm dimension is a distance between the two end effectors of the robot arm, and the scratch dimension is a distance between two of the scratch marks. The robot arm dimension is determined to match the scratch dimension if the scratch dimension is substantially equal to the robot arm dimension. In other words, the corresponding comparing result is a match.

In other embodiments, the robot arm dimension is a width of an end effector of the robot arm of the robot arm, and the scratch dimension is a width of the scratch mark. The robot arm dimension is determined to match the scratch dimension if the scratch dimension is substantially equal to or less than the robot arm dimension. In other words, the corresponding comparing result is a match.

In other embodiments, the robot arm dimension is a width of a forearm of the robot arm, and the scratch dimension is a width of the scratch mark. The robot arm dimension is determined to match the scratch dimension if the scratch dimension is substantially equal to or less than the robot arm dimension. In other words, the corresponding comparing result is a match.

In other embodiments, the robot arm dimension is a distance, when the robot arm is extended to a fullest extent towards the wafer and in an extending direction of the robot arm, between a terminal tip of an end effector of the robot arm and a furthest point on the edge of the wafer, and the scratch dimension is a distance, in a direction of a length of the scratch mark, between a furthest point on the edge of the wafer and an end point on the scratch mark closest to the edge. The robot arm dimension is determined to match the scratch dimension if the scratch dimension is substantially equal to or greater than the robot arm dimension. In other words, the corresponding comparing result is a match. Alternately, the robot arm dimension is a distance, when the robot arm is extended to a fullest extent towards the wafer and in an extending direction of the robot arm, between a terminal tip of an end effector of the robot arm and a center of the wafer, and the scratch dimension is a distance, in a direction of a length of the scratch mark, between a furthest point on the edge of the wafer and an end point on the scratch mark closest to the edge. The robot arm dimension is determined to match the scratch dimension if the scratch dimension is substantially equal to or less than the robot arm dimension. In other words, the corresponding comparing result is a match.

In other embodiments, the robot arm dimension is a distance, in a direction perpendicular to the extending direction of the robot arm, between the end effector of the robot arm and a furthest point on the edge of the wafer, and the scratch dimension is a distance, in a direction perpendicular to the length of the scratch mark, between the scratch mark and a furthest point on the edge of the wafer. The robot arm dimension is determined to match the scratch dimension if the scratch dimension is substantially equal to the robot arm dimension. In other words, the corresponding comparing result is a match. Alternately, the robot arm dimension is a distance, in a direction perpendicular to the extending direction of the robot arm, between the end effector of the robot arm and a center of the wafer, and the scratch dimension is a distance, in a direction perpendicular to the length of the scratch mark, between the scratch mark and a furthest point on the edge of the wafer. The robot arm dimension is determined to match the scratch dimension if the scratch dimension is substantially equal to the robot arm dimension. In other words, the corresponding comparing result is a match.

In step S04, a robot arm is identified based on the comparing results in step S03. The robot arm can be identified if the robot arm has a corresponding robot arm parameter corresponding to a comparing result that is a match in step S03.

Alternately, the robot arm can be identified if the robot arm has a corresponding robot arm parameter corresponding to a comparing result that is a match, and no robot arm parameter corresponding to a comparing result that is an exclusion, based on the comparison in step S03.

In some embodiments, if the robot arm dimension is a distance between the two end effectors of the robot arm, then the corresponding scratch dimension is determined to match the robot arm dimension if the scratch dimension is substantially equal to the robot arm dimension. In this case, the corresponding comparing result is a match. On the other hand, if the scratch dimension is substantially different from the robot arm dimension, then the scratch marks could not have been created by the two end effectors of that particular robot arm, and therefore the robot arm dimension is excluded and the robot arm is not identified. In this case, the corresponding comparing result is an exclusion. In some embodiments, the scratch dimension is substantially equal to the robot arm dimension if the scratch dimension is different from the robot arm dimension by less than about 5%, and substantially different from the robot arm dimension if the scratch dimension is different from the robot arm dimension by more than about 5%.

In other embodiments, if the robot arm dimension is a width of one of the end effectors of the robot arm, then the corresponding scratch dimension is determined to match the robot arm dimension if the scratch dimension is substantially equal to or less than the robot arm dimension. In this case, the corresponding comparing result is a match. On the other hand, if the scratch dimension is greater than the robot arm dimension, then the robot arm dimension is excluded because the end effector cannot create a scratch having a width wider than the width of the end effector itself, and the robot arm is not identified. In this case, the corresponding comparing result is an exclusion. In some embodiments, the scratch dimension is substantially equal to the robot arm dimension if the scratch dimension is different from the robot arm dimension by less than about 5%, and substantially less than or greater than the robot arm dimension if the scratch dimension is respectively less than or greater than the robot arm dimension by more than about 5%. In these embodiments, the robot arm dimension that is a width of one of the end effectors of the robot arm is determined to match the corresponding scratch dimension if the scratch dimension is less than about 1.05 times the robot arm dimension, and determined to be excluded if the scratch dimension is greater than about 1.05 times the robot arm dimension. In some embodiments, the robot arm dimension that is the width of one of the end effectors of the robot arm is between about 10 mm and about 35 mm.

In other embodiments, if the robot arm dimension is a width of a forearm of the robot arm, then the corresponding scratch dimension is determined to match the robot arm dimension if the scratch dimension is substantially equal to or less than the robot arm dimension. In this case, the corresponding comparing result is a match. On the other hand, if the scratch dimension is greater than the robot arm dimension, then the robot arm dimension is excluded because the forearm cannot create a scratch having a width wider than the width of the forearm itself, and the robot arm is not identified. In this case, the corresponding comparing result is an exclusion. In some embodiments, the scratch dimension is substantially equal to the robot arm dimension if the scratch dimension is different from the robot arm dimension by less than about 5%, and substantially less than or greater than the robot arm dimension if the scratch dimension is respectively less than or greater than the robot arm dimension by more than about 5%. In these embodiments, the robot arm dimension that is a width of a forearm of the robot arm is determined to match the corresponding scratch dimension if the scratch dimension is less than about 1.05 times the robot arm dimension, and determined to be excluded if the scratch dimension is greater than about 1.05 times the robot arm dimension.

In other embodiments, if the robot arm dimension is a distance, when the robot arm is extended to a fullest extent towards the wafer and in an extending direction of the robot arm, between a terminal tip of an end effector of the robot arm and a furthest point on the edge of the wafer, then the corresponding scratch dimension is determined to match the robot arm dimension if the scratch dimension is substantially equal to or greater than the robot arm dimension. In this case, the corresponding comparing result is a match. On the other hand, if the scratch dimension is less than the robot arm dimension, then the scratch mark is created by a robot arm that can reach further toward the furthest point on the edge of the wafer than the robot arm corresponding to the robot arm dimension in question can reach when extended to a fullest extent, and therefore the robot arm dimension is excluded and the robot arm is not identified. In this case, the corresponding comparing result is an exclusion. In some embodiments, the scratch dimension is substantially equal to the robot arm dimension if the scratch dimension is different from the robot arm dimension by less than about 5%, and substantially less than or greater than the robot arm dimension if the scratch dimension is respectively less than or greater than the robot arm dimension by more than about 5%. In these embodiments, the robot arm dimension that is a distance, when the robot arm is extended to a fullest extent towards the wafer and in an extending direction of the robot arm, between a terminal tip of an end effector of the robot arm and a furthest point on the edge of the wafer is determined to match the corresponding scratch dimension if the scratch dimension is greater than about 0.95 times the robot arm dimension, and determined to be excluded if the scratch dimension is less than about 0.95 times the robot arm dimension.

In some embodiments, the robot arm dimension that is the distance between a terminal tip of an end effector of the robot arm and a furthest point on the edge of the wafer, when the robot arm is extended to a fullest extent towards the wafer and in an extending direction of the robot arm, is between about 50 mm and about 105 mm.

In other embodiments, if the robot arm dimension is a distance, in a direction perpendicular to the extending direction of the robot arm, between the end effector of the robot arm and a furthest point on the edge of the wafer, then the corresponding scratch dimension is determined to match the robot arm dimension if the scratch dimension is substantially equal to the robot arm dimension. In this case, the corresponding comparing result is a match. On the other hand, if the scratch dimension is substantially different from the robot arm dimension, then the scratch mark could not have been created by the end effectors of that particular robot arm, and therefore the robot arm dimension is excluded and the robot arm is not identified. In this case, the corresponding comparing result is an exclusion. In some embodiments, the scratch dimension is substantially equal to the robot arm dimension if the scratch dimension is different from the robot arm dimension by less than about 5%, and substantially different from the robot arm dimension if the scratch dimension is different from the robot arm dimension by more than about 5%.

In some embodiments, the robot arm dimension that is the distance, in a direction perpendicular to the extending direction of the robot arm, between the end effector of the robot arm and a furthest point on the edge of the wafer is between about 50 mm and about 105 mm.

Figure 4:
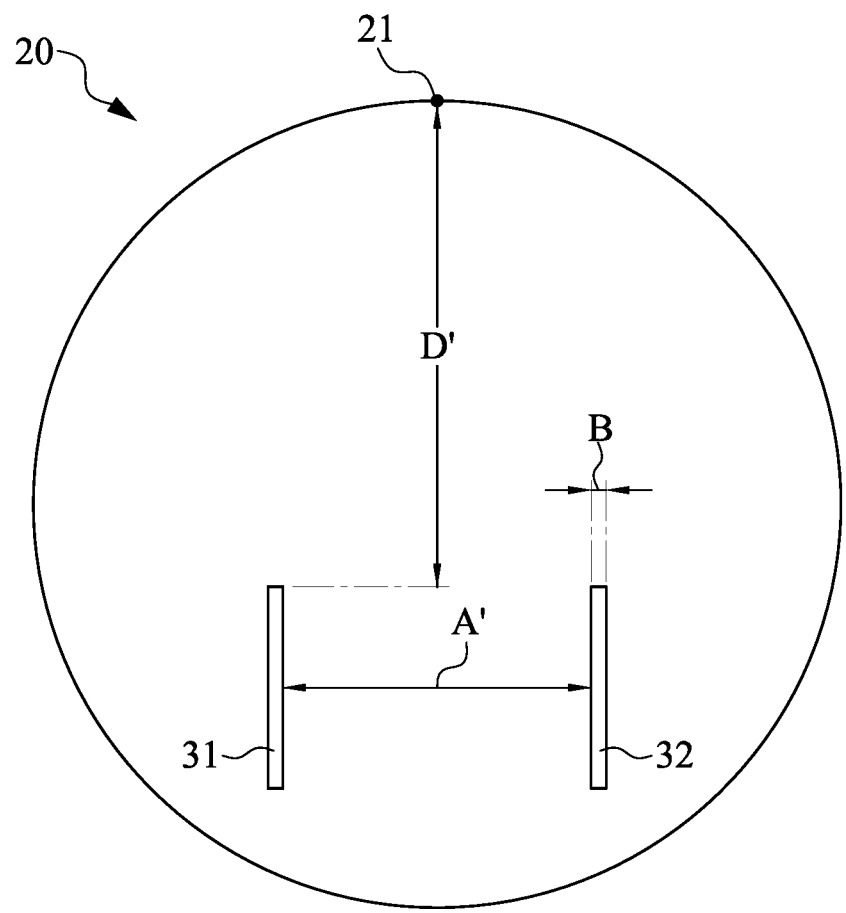
FIG. 4 shows a top view of a wafer having scratches, in accordance with some embodiments.

Consider, in some embodiments, a wafer 20 with scratch marks 31 and 32 as shown in FIG. 4. Applying the method shown in FIG. 3 to the wafer 20, in step S01 scratch marks 31 and 32 are detected. In step S02, scratch dimensions A', B', and D' are determined. Specifically, the scratch dimension A' is a distance between two scratch marks 31 and 32, the scratch dimension B' is a width of the scratch mark 32 created by an end effector of a robot arm, and the scratch dimension D' is a distance, in a direction of a length of the scratch mark, between a furthest point 21 on the edge of the wafer 20 and an end point on the scratch mark 31 closest to the edge.

Figure 5A:
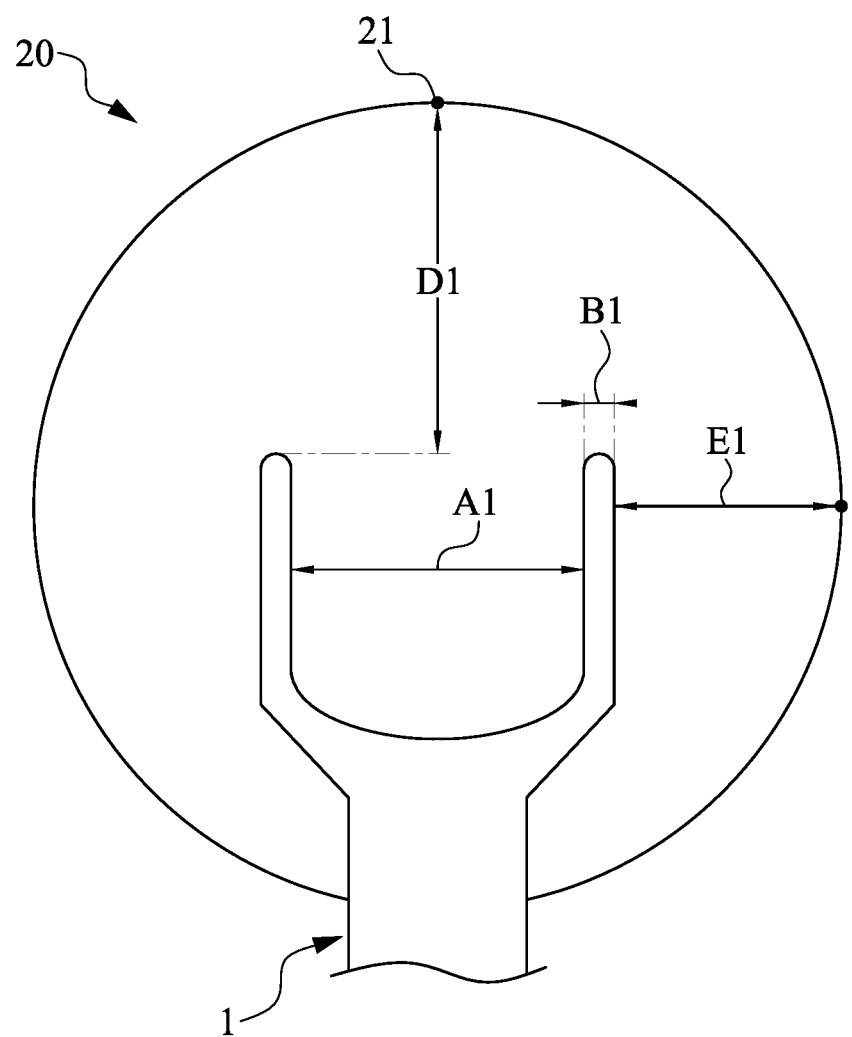
FIG. 5A shows a top view of a robot arm and a wafer, in accordance with some embodiments.
Figure 5B:
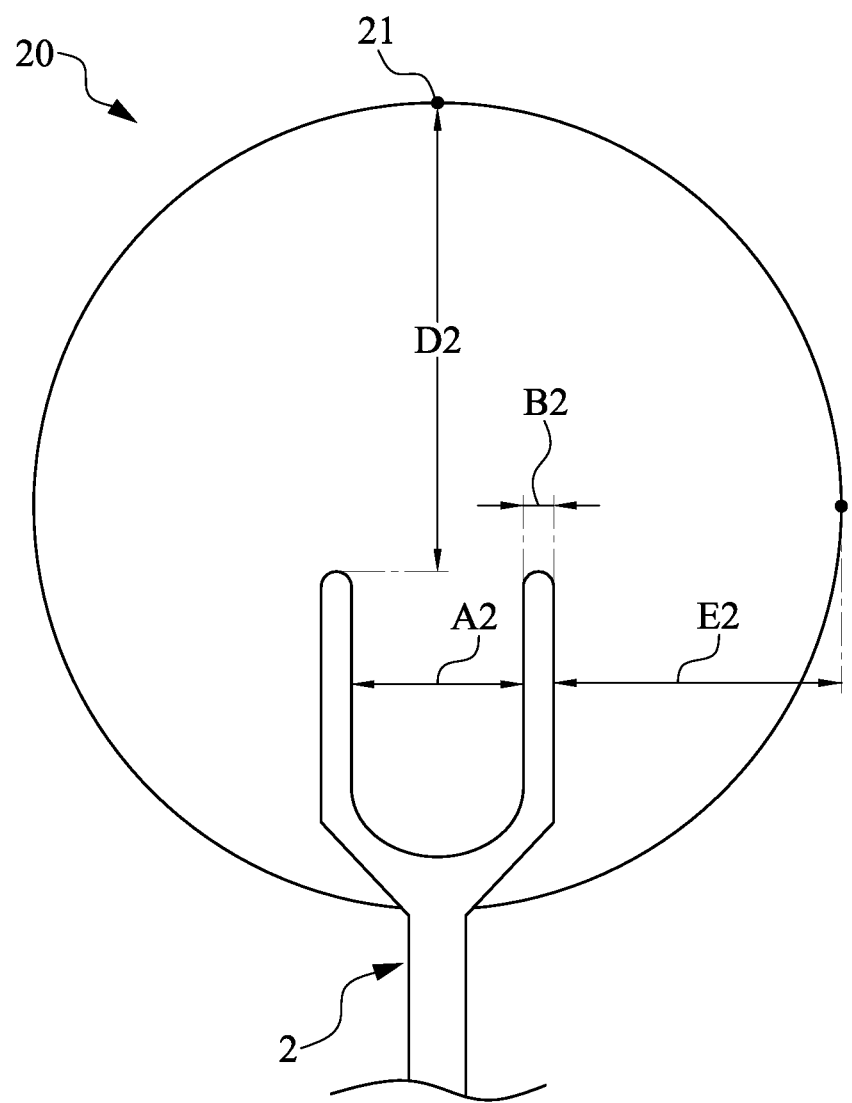
FIG. 5B shows a top view of another robot arm and a wafer, in accordance with some embodiments.

In step S03, the scratch dimension A' is compared to robot arm dimensions A1 and A2 shown in FIG. 5A and FIG. 5B, the scratch dimension B' is compared to robot arm dimensions B1 and B2 shown in FIG. 5A and FIG. 5B, and the scratch dimension D' is compared to robot arm dimensions D1 and D2 shown in FIG. 5A and FIG. 5B. The scratch dimension B' is matched to the robot arm dimensions B1 and B2 because the scratch dimension B' is substantially equal to or less than the robot arm dimensions B1 and B2. The scratch dimension D' is matched to the robot arm dimensions D1 and D2 because the scratch dimension D' is substantially equal to or greater than the robot arm dimensions D1 and D2. The scratch dimension A' is matched to the robot arm dimension A1 because the scratch dimension A' is substantially equal to the robot arm dimension A1. However, the robot arm dimension A2 is excluded because the scratch dimension A' is substantially different from the robot arm dimension A2.

In step S04, the robot arm 1 of FIG. 5B has the corresponding robot arm dimension A2 that is excluded, so is not identified as a possible robot arm responsible for producing the scratch marks 31 and 32 on the wafer 20. On the other hand, each of the robot arm dimensions of the robot arm 1 of FIG. 5A matches one of the scratch dimensions of the scratch marks 31 and 32 on the wafer 20, so the robot arm 1 is identified as a possible robot arm responsible for producing the scratch marks 31 and 32 on the wafer 20.

In cases where only one scratch is detected on the wafer, the scratch dimension A is undetermined and the robot arm dimension A cannot be used directly for comparison. However, if the radius of the wafer is known, a robot arm dimension E can be calculated from the robot arm dimension A, and be compared to the scratch dimension E'.

Figure 6:
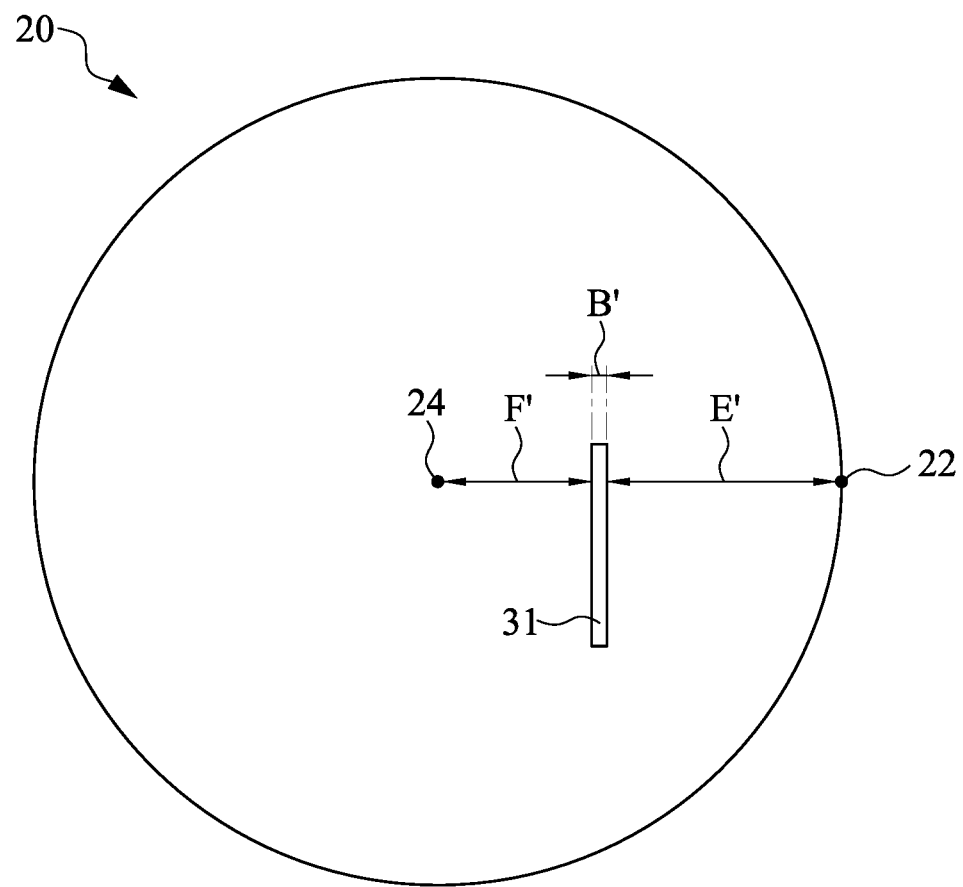
FIG. 6 shows a top view of a wafer having a scratch, in accordance with some embodiments.

Consider another wafer shown in FIG. 6. Applying the method shown in FIG. 3 to the wafer 20, the wafer 20 with a scratch mark 31 is detected in step S01. In step S02, scratch dimensions B' and E' are determined. Specifically, the scratch dimension B' is a width of the scratch mark 31 created by an end effector of a robot arm. The scratch dimension E' is a distance, in a direction perpendicular to the length of the scratch mark, between the scratch mark 31 and a furthest point 22 on the edge of the wafer 20.

In step S03, referring again to the robot arms in FIG. 5A and FIG. 5B, the scratch dimension B' is compared to the robot arm dimensions B1 and B2, and the scratch dimension E' is compared to the robot arm dimensions E1 and E2. The scratch dimension B' is matched to the robot arm dimensions B1 and B2 because the scratch dimension B' is substantially equal to or less than the robot arm dimensions B1 and B2. The scratch dimension E' is matched to the robot arm dimension E1 because the scratch dimension E' is substantially equal to the robot arm dimension E1. However, the robot arm dimension E2 is excluded because the scratch dimension E' is substantially different from the robot arm dimension E2. Robot arm dimensions A1 and A2 are neither matched nor excluded, because no corresponding scratch dimensions is determined from the scratch mark 31.

In step S04, the robot arm 1 of FIG. 5B has the corresponding robot arm dimension E2 that is excluded, so is not identified as a possible robot arm responsible for producing the scratch mark 31 on the wafer 20. On the other hand, the robot arm 1 of FIG. 5A has at least one robot arm dimension matching one of the scratch dimensions of the scratch mark 31 on the wafer 20, and no robot arm dimension excluded by comparison to one of the scratch dimensions, so the robot arm 1 of FIG. 5A is identified as a possible robot arm responsible for producing the scratch mark 31 on the wafer 20.

Alternately, in cases where only one scratch is detected on the wafer, if the center 24 of the wafer can be determined, a scratch dimension F' that is a distance between the center 24 of the wafer and the scratch mark 31 can be determined, and compared to the robot arm dimension A which should be substantially double the value of a matching scratch dimension F'.

Consider the same wafer shown in FIG. 6. Applying the method shown in FIG. 3 to the wafer 20, the wafer 20 with a scratch mark 31 is detected in step S01. In some embodiments, in step S02 scratch dimensions B' and F' are determined. Specifically, the scratch dimension B' is a width of the scratch mark 31 created by an end effector of a robot arm. The scratch dimension F' is a distance, in a direction perpendicular to the length of the scratch mark 31, between the scratch mark 31 and the center 24 of the wafer 20.

In step S03, referring again to the robot arms in FIG. 5A and FIG. 5B, the scratch dimension B' is compared to the robot arm dimensions B1 and B2, and the scratch dimension F' is compared to the robot arm dimensions A1 and A2. The scratch dimension F' is matched to the robot arm dimension A1 because the scratch dimension F' is substantially equal to the robot arm dimension A1 times one half. However, the robot arm dimension A2 is excluded because the scratch dimension F' is substantially different from the robot arm dimension A2 times one half.

In step S04, the scratch dimension B' is matched to the robot arm dimensions B1 and B2 because the scratch dimension B' is substantially equal to or less than the robot arm dimensions B1 and B2. The robot arm 1 of FIG. 5B has the corresponding robot arm dimension A2 that is excluded, so is not identified as a possible robot arm responsible for producing the scratch mark 31 on the wafer 20. On the other hand, the robot arm 1 of FIG. 5A has at least one robot arm dimension matching one of the scratch dimensions of the scratch mark 31 on the wafer 20, and no robot arm dimension excluded by comparison to one of the scratch dimensions, so the robot arm 1 of FIG. 5A is identified as a possible robot arm responsible for producing the scratch mark 31 on the wafer 20.

Figure 7:
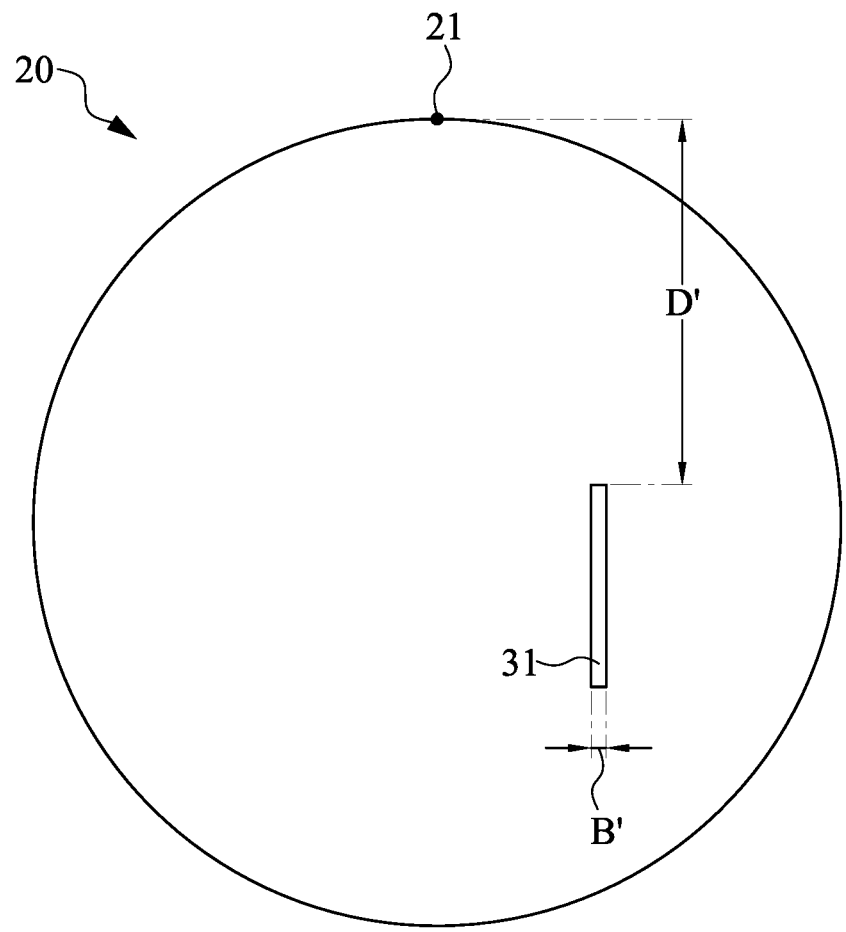
FIG. 7 shows a top view of a wafer having a scratch, in accordance with some embodiments.

Consider another wafer shown in FIG. 7. Applying the method shown in FIG. 3 to the wafer 20, the wafer 20 with a scratch mark 31 is detected in step S01. In step S02, scratch dimensions B' and D' are determined. Specifically, the scratch dimension B' is a width of the scratch mark 31 created by an end effector of a robot arm. The scratch dimension D' is a distance, in the direction of the length of the scratch mark, between a furthest point 21 on the edge of the wafer 20 and an end point on the scratch mark 31 closest to the edge.

In step S03, referring again to the robot arms in FIG. 5A and FIG. 5B, the scratch dimension B' is compared to the robot arm dimensions B1 and B2, and the scratch dimension D' is compared to the robot arm dimensions D1 and D2. The scratch dimension B' is matched to the robot arm dimensions B1 and B2 because the scratch dimension B' is substantially equal to or less than the robot arm dimensions B1 and B2. The scratch dimension D' is matched to the robot arm dimension D1 because the scratch dimension D' is equal to or greater than D1. However, the robot arm dimension D2 is excluded because the scratch dimension D' is less than D2.

In step S04, the robot arm 1 of FIG. 5B has the corresponding robot arm dimension D2 that is excluded, so is not identified as a possible robot arm responsible for producing the scratch mark 31 on the wafer 20. On the other hand, the robot arm 1 of FIG. 5A has at least one robot arm dimension matching one of the scratch dimensions of the scratch mark 31 on the wafer 20, and no robot arm dimension excluded by comparison to one of the scratch dimensions, so the robot arm 1 of FIG. 5A is identified as a possible robot arm responsible for producing the scratch mark 31 on the wafer 20.

Figure 8:
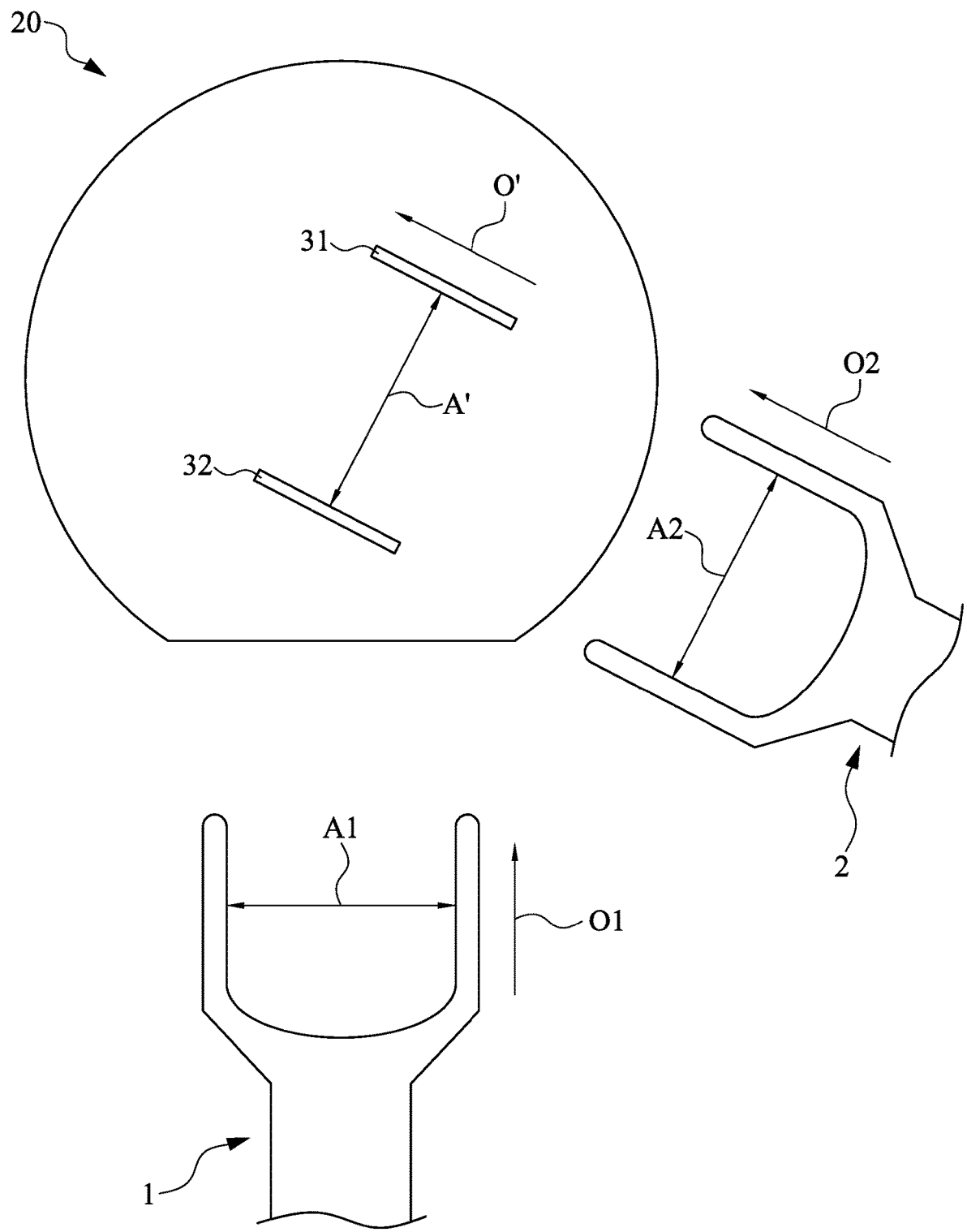
FIG. 8 shows a top view of a wafer having scratches and two robot arms, in accordance with some embodiments.

Consider, in some embodiments, a wafer 20 with scratch marks 31 and 32, as shown in FIG. 8. In step S01, scratch marks 31 and 32 are detected. In step S02, a scratch orientation O' is determined, and a scratch dimension A' is determined.

In step S03, the scratch orientation O' is compared to robot arm orientations O1 and O2, and the scratch dimension A' is compared to robot arm dimensions A1 and A2, which are substantially the same in FIG. 8.

In step S04, a robot arm 2 having the robot arm orientation O2 matching the scratch orientation O', and the robot arm dimension A2 matching the scratch dimension A' is identified as a possible robot arm responsible for producing the scratch marks 31 and 32 on the wafer 20. On the other hand, a robot arm orientation O1 of a robot arm 1 is not matched, so the robot arm 1 is not identified as a possible robot arm responsible for producing the scratch marks 31 and 32 on the wafer 20. Note that the robot arm 1 has the robot arm dimension A1 that matches the scratch dimension A'. However, the robot arm 1 is differentiated from the robot arm 2 by the orientations at which they operate on the wafer 20, and the scratch orientation is helpful in identifying the relevant robot arm.

Consider the same wafer 20 with scratch marks 31 and 32 shown in FIG. 8. In some embodiments, in step S01 scratch marks 31 and 32 are detected. In step S02, a scratch orientation O' is determined. In step S03, the scratch orientation O' is compared to robot arm orientations O1 and O2. In step S04, a robot arm 2 having the robot arm orientation O2 matching the scratch orientation O' is identified as a possible robot arm responsible for producing the scratch marks 31 and 32 on the wafer 20. On the other hand, a robot arm orientation O1 of a robot arm 1 is not matched, so the robot arm 1 is not identified as a possible robot arm responsible for producing the scratch marks 31 and 32 on the wafer 20. In some embodiments, a comparison of only the scratch orientation and the robot arm orientations is sufficient for identifying the robot arm responsible for creating the scratch.

Figure 9:
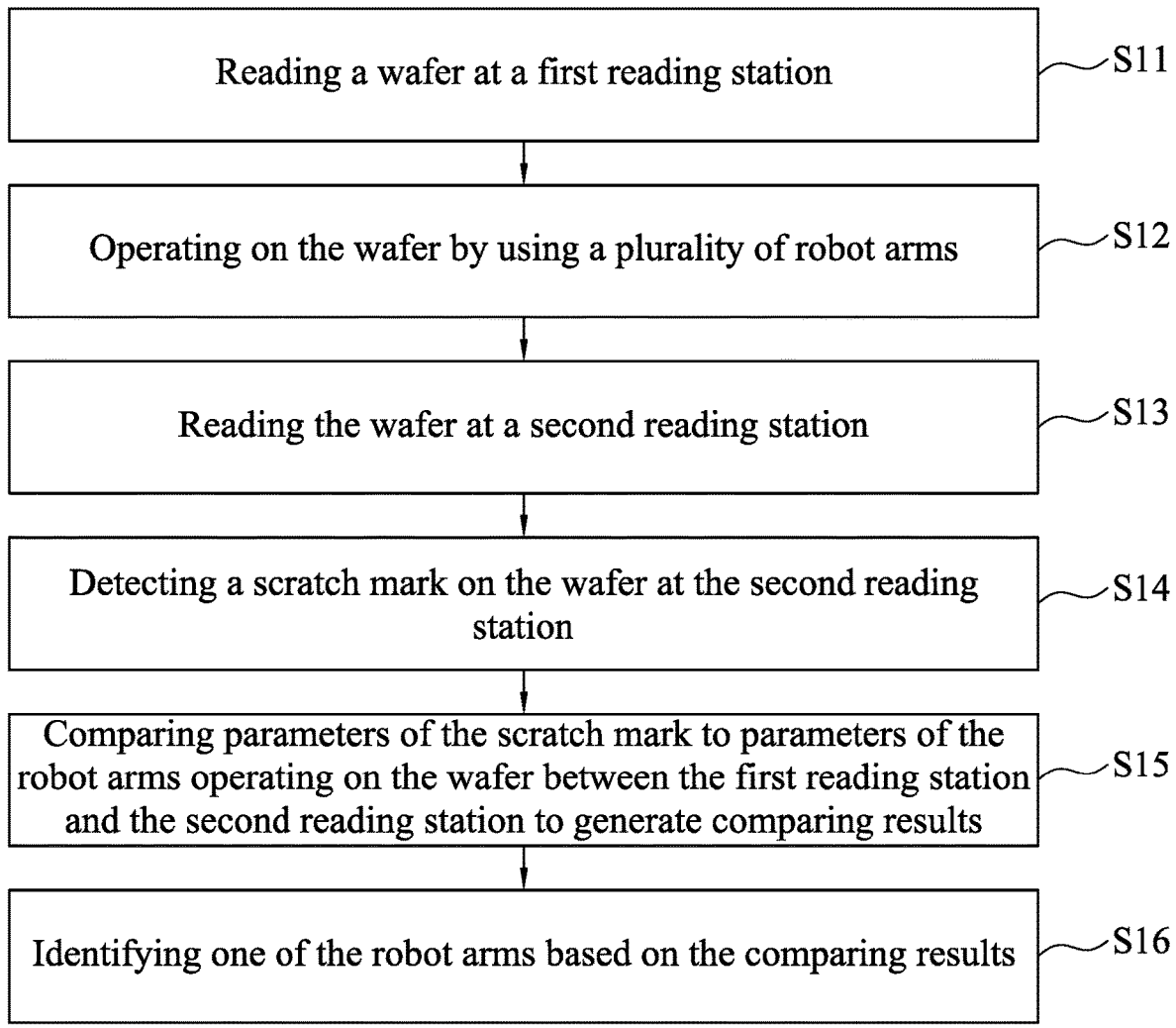
FIG. 9 shows a flowchart of a method for identifying a robot arm responsible for producing a scratch on a wafer, in accordance with some embodiments.

In some embodiments of the present disclosure, wafers can be read for scratch marks at particular stations in the wafer manufacturing process. If a scratch mark is detected during one of these wafer readings, then only robot arm parameters corresponding to robot arms that operate on the wafer between the present wafer reading and the previous wafer reading are compared to the scratch parameters of the detected scratch mark. Specifically, referring to FIG. 9, a wafer is read at a first reading station in step S11. After reading the wafer at the first reading station, in step S12 the wafer is operated on by using a plurality of robot arms. After operating on the wafer using the robot arms, in step S13 the wafer is read at a second reading station. In step S14, a scratch mark on the wafer is detected at the second reading station. In step S15, parameters of the scratch mark are compared to parameters of the robot arms operating on the wafer between the first reading station and the second reading station to generate comparing results. In step S16, one of the robot arms is identified based on the comparing results.

Figure 10:
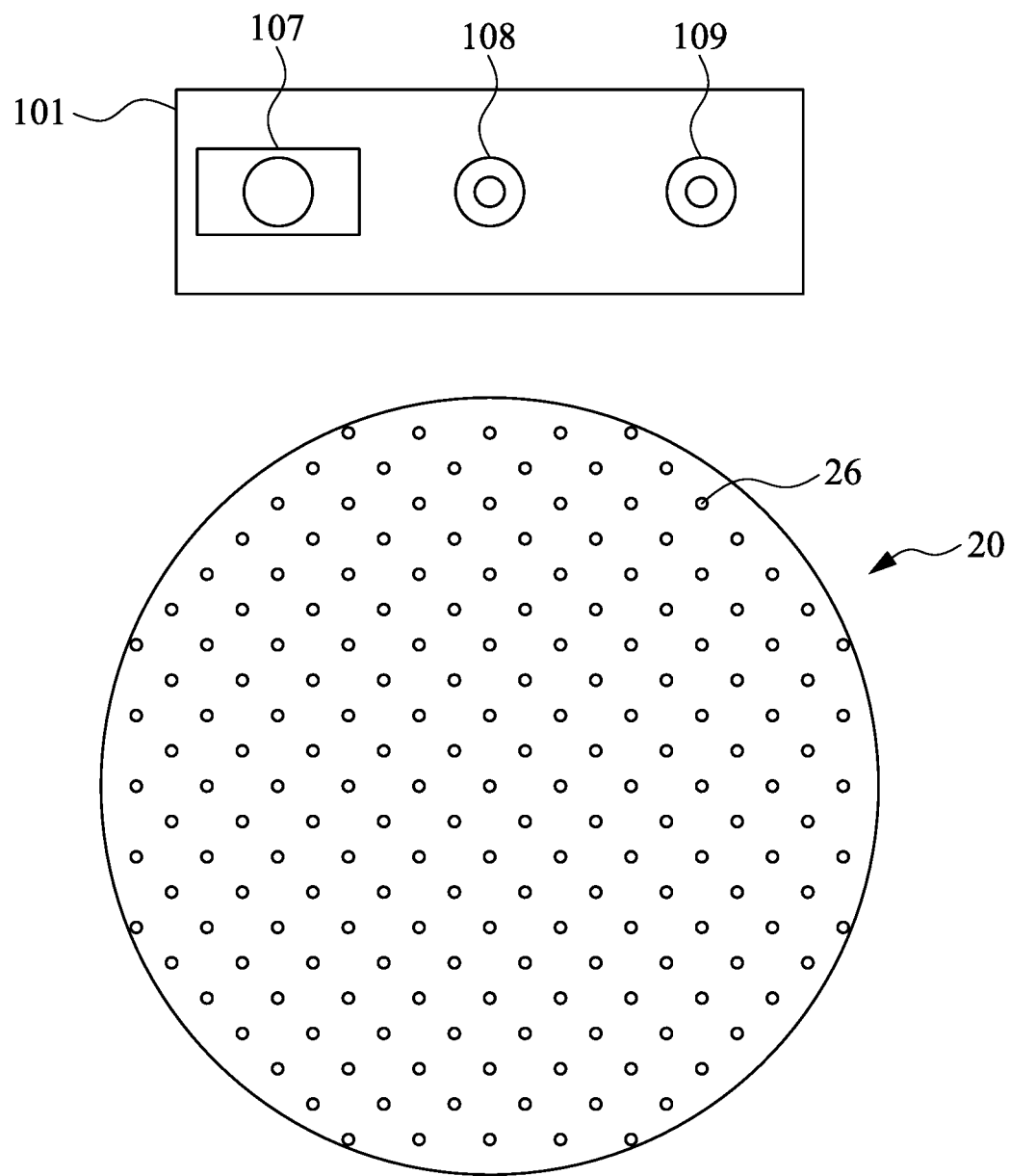
FIG. 10 shows a schematic diagram of a dot projector, an infrared camera, a complementary metal-oxide-semiconductor (CMOS) image sensor, and a wafer, in accordance with some embodiments.

As shown in FIG. 10, in some embodiments of the present disclosure, the first reading station and the second reading station can be a camera module 101 including a dot projector 107, an infrared camera 108, and a complementary metal-oxide-semiconductor (CMOS) image sensor 109. To facilitate detection, light can be projected onto the wafer 20 via the dot projector 107, to create an array of dots 26 on the wafer 20. The infrared camera 108 may be used to read the dotted array 26 reflected from the wafer 20, to calculate the positions of a scratch on the wafer 20. Additionally, a two dimensional image of the wafer 20 may be taken by the CMOS image sensor 109, and the information may be combined with the information gathered by the infrared camera 108, to determine scratch dimensions such as width, length, distance, orientation, etc. In some embodiments, the dot projector 107 is a vertical-cavity surface-emitting laser.

Figure 11:
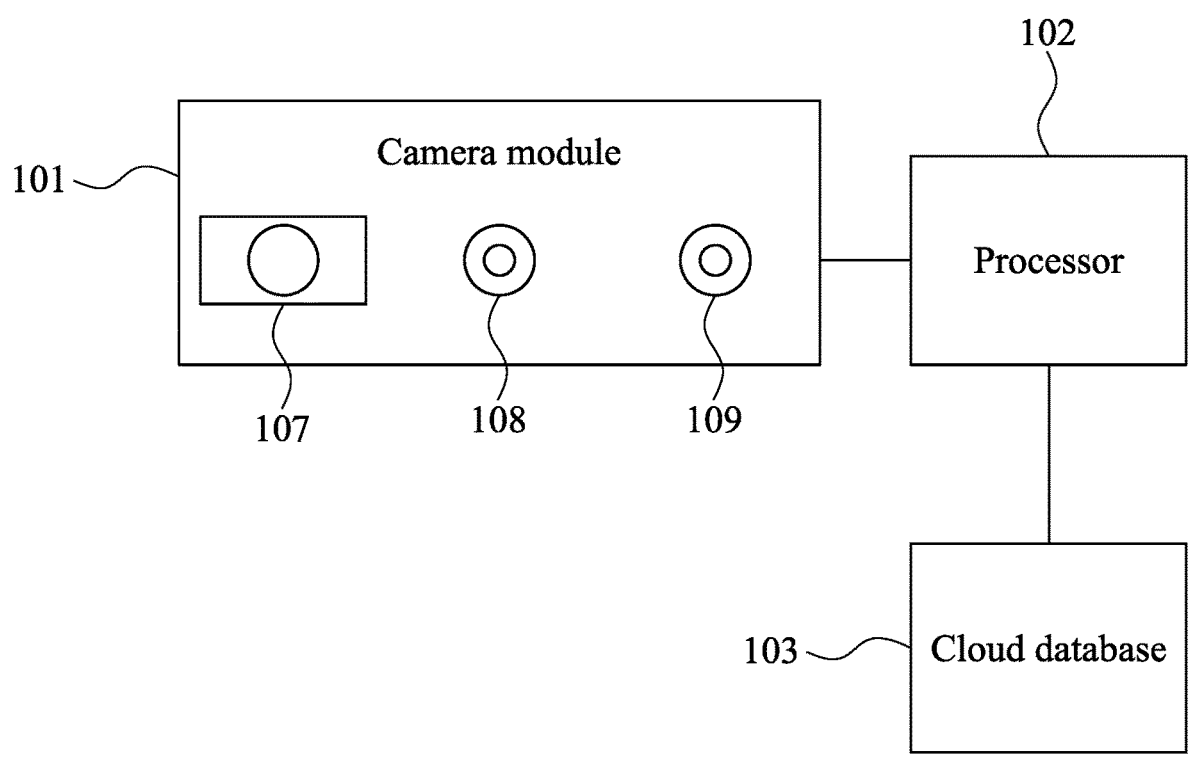
FIG. 11 shows a schematic diagram of a system for identifying a robot arm responsible for a scratch on a wafer, in accordance with some embodiments.

As shown in FIG. 11, in some embodiments of the present disclosure, a system 100 for identifying a robot arm responsible for a scratch on a wafer is provided. The system 100 includes a camera module 101 configured to detect and read a scratch on a wafer, a processor 102 configured to determine parameters of the scratch according to an algorithm, a cloud database 103 configured to store robot arm parameters, and the processor 102 further configured to compare a scratch parameter to a robot arm parameter and identify a robot arm based on the comparison.

By storing robot arm parameters in a cloud database 103 that is accessible by a computer, detected scratch marks and the scratch mark parameters thereof can be quickly calculated and compared to the stored robot arm parameters, to generate comparing results. Based on the comparing results, possible robot arms responsible for creating the detected scratches can be quickly identified.

In some embodiments of the present disclosure, at least one scratch mark on a wafer is detected in a method. A first scratch dimension of the at least one scratch mark is determined. The determined first scratch dimension is compared to a plurality of first robot arm dimensions to generate a plurality of first comparing results, wherein the first comparing results respectively correspond to a plurality of robot arms. One of the robot arms is identified based on the first comparing results.

In some embodiments of the present disclosure, at least one scratch mark on a wafer is detected in a method. A scratch orientation of the at least one scratch mark is determined. The determined scratch orientation is compared to a plurality of robot arm orientations to generate a plurality of first comparing results, wherein the first comparing results respectively correspond to a plurality of robot arms. One of the robot arms is identified based on the first comparing results.

In some embodiments of the present disclosure, a wafer is read at a first reading station in a method. The wafer is operated on using a plurality of robot arms after reading the wafer at the first reading station. The wafer is read at a second reading station after operating on the wafer using the robot arms. A scratch mark on the wafer is detected at the second reading station. Parameters of the scratch mark is compared to parameters of the robot arms operating on the wafer between the first reading station and the second station to generate comparing results. One of the robot arms is identified based on the comparing results.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    detecting two scratch marks on a wafer;
    determining a first scratch dimension of the scratch marks, wherein the first scratch dimension is a distance between two of the scratch marks;
    comparing the determined first scratch dimension to a plurality of first robot arm dimensions to generate a plurality of first comparing results, wherein the first comparing results respectively correspond to a plurality of robot arms, and each of the first robot arm dimensions is a distance between two end effectors of the corresponding robot arm; and
    identifying one of the robot arms based on the first comparing results.

2. The method according to claim 1, further comprising:
    determining a second scratch dimension of the scratch marks; and
    comparing the determined second scratch dimension to a plurality of second robot arm dimensions to generate a plurality of second comparing results, wherein the second comparing results respectively correspond to the robot arms, and said one of the robot arms is identified when the first comparing result corresponding to said one of the robot arms is a match and the second comparing result corresponding to said one of the robot arms is a match.

3. The method according to claim 1, further comprising:
    determining a second scratch dimension of the scratch marks; and
    comparing the determined second scratch dimension to a plurality of second robot arm dimensions to generate a plurality of second comparing results, wherein the second comparing results respectively correspond to the robot arms, and said one of the robot arms is identified when the first comparing result corresponding to said one of the robot arms is a match and the second comparing result corresponding to said one of the robot arms is not an exclusion.

4. The method according to claim 1, wherein comparing the determined first scratch dimension to the first robot arm dimensions is performed such that when the first scratch dimension is substantially equal to one of the first robot arm dimensions, the corresponding first comparing result is a match.

5. The method according to claim 1, wherein comparing the determined first scratch dimension to the first robot arm dimensions is performed such that when the first scratch dimension is substantially different from one of the first robot arm dimensions, the corresponding first comparing result is an exclusion.

6. The method according to claim 1, further comprising:
    determining a second scratch dimension of the scratch marks, wherein the second scratch dimension is a width of the scratch marks; and
    comparing the second scratch dimension to a plurality of second robot arm dimensions to generate a plurality of second comparing results, wherein each of the second robot arm dimensions is a width of the end effectors of the corresponding robot arm.

7. The method according to claim 6, wherein comparing the determined second scratch dimension to the second robot arm dimensions is performed such that when the second scratch dimension is substantially equal to or less than one of the second robot arm dimensions, the corresponding second comparing result is a match.

8. The method according to claim 1, further comprising:
    determining a second scratch dimension of the scratch marks, wherein the second scratch dimension is a width of the scratch marks; and
    comparing the determined second scratch dimension to a plurality of second robot arm dimensions to generate a plurality of second comparing results, wherein each of the second robot arm dimensions is a width of a forearm of the corresponding robot arm.

9. The method according to claim 8, wherein comparing the determined second scratch dimension to the second robot arm dimensions is performed such that when the second scratch dimension is substantially equal to or less than one of the second robot arm dimensions, the corresponding second comparing result is a match.

10. The method according to claim 1, further comprising:
    determining a second scratch dimension of the scratch marks, wherein the second scratch dimension is a distance, when the corresponding robot arm is extended to a fullest extent towards the wafer and in an extending direction of the corresponding robot arm, between a terminal tip of one of the end effectors of the corresponding robot arm and a furthest point on an edge of the wafer; and
    comparing the determined second scratch dimension to a plurality of second robot arm dimensions to generate a plurality of second comparing results, wherein the second scratch dimension is a distance, in a direction of a length of the scratch marks, between an end point of the scratch marks and the furthest point on the edge of the wafer.

11. The method according to claim 10, wherein comparing the determined second scratch dimension to the second robot arm dimensions is performed such that when the second scratch dimension is substantially equal to or greater than one of the second robot arm dimensions, the corresponding second comparing result is a match.

12. A method, comprising:
    detecting at least one scratch mark on a wafer;
    determining a scratch orientation of the at least one scratch mark;
    comparing the determined scratch orientation to a plurality of robot arm orientations to generate a plurality of first comparing results, wherein the first comparing results respectively correspond to a plurality of robot arms;
    determining a scratch dimension of the at least one scratch mark, wherein the scratch dimension is a distance, in a direction perpendicular to a direction of a length of the at least one scratch mark, between the at least one scratch mark and a furthest point on an edge of the wafer;
    comparing the determined scratch dimension to a plurality of robot arm dimensions to generate a plurality of second comparing results, wherein the second comparing results respectively correspond to the robot arms, and each of the robot arm dimensions is a distance, in a direction perpendicular to an extending direction of the corresponding robot arm, between an end effector of the corresponding robot arm and the furthest point on the edge of the wafer; and
    identifying one of the robot arms based on at least the second comparing results.

13. The method according to claim 12, wherein comparing the determined scratch dimension to the plurality of robot arm dimensions is performed such that when the scratch dimension is substantially equal to one of the robot arm dimensions, the corresponding second comparing result is a match.

14. A method, comprising:
    moving a wafer by sequentially using a plurality of robot arms;
    detecting a scratch mark of the wafer after moving the wafer by sequentially using the robot arms;
    measuring a scratch position of the scratch mark on the wafer, wherein the scratch position of the scratch mark is defined by a distance between the scratch mark and an edge of the wafer;
    comparing the scratch position of the scratch mark with positions of the robot arms holding the wafer to generate a plurality of first comparing results; and
    identifying one of the robot arms based on the first comparing results.

15. The method of claim 14, further comprising:
    measuring a scratch size of the scratch mark; and
    comparing the scratch size of the scratch mark with sizes of end effectors of the robot arms to generate a plurality of second comparing results, wherein identifying one of the robot arms is further based on the second comparing results.

16. The method according to claim 12, wherein the scratch orientation of the scratch mark is defined by a notch of the wafer.

17. The method according to claim 12, further comprising identifying said one of the robot arms based on the first comparing results.

18. The method according to claim 17, wherein said one of the robot arms is identified when the first comparing result corresponding to said one of the robot arms is a match, and the second comparing result corresponding to said one of the robot arms is a match.

19. The method according to claim 14, further comprising:
    determining a scratch orientation of the scratch mark on the wafer;
    comparing the determined scratch orientation with the robot arms holding the wafer to generate a plurality of second comparing results; and
    identifying said one of the robot arms further based on the second comparing results.

20. The method according to claim 19, wherein the scratch orientation of the scratch mark is defined by a notch of the wafer.

* * * * *